US009585241B2

(12) United States Patent
Hable et al.

(10) Patent No.: US 9,585,241 B2
(45) Date of Patent: Feb. 28, 2017

(54) SUBSTRATE, CHIP ARRANGEMENT, AND METHOD FOR MANUFACTURING THE SAME

(71) Applicant: Infineon Technologies AG, Neubiberg (DE)

(72) Inventors: Wolfram Hable, Neumarkt (DE); Andreas Grassmann, Regensburg (DE); Frank Winter, Regensburg (DE); Ottmar Geitner, Pentling (DE); Alexander Schwarz, Moehnesee (DE); Alexander Herbrandt, Warstein (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 79 days.

(21) Appl. No.: 14/034,669

(22) Filed: Sep. 24, 2013

(65) Prior Publication Data
US 2015/0085446 A1   Mar. 26, 2015

(51) Int. Cl.
| | |
|---|---|
| H05K 7/20 | (2006.01) |
| H05K 1/02 | (2006.01) |
| H05K 3/32 | (2006.01) |
| H01L 23/31 | (2006.01) |
| H01L 23/373 | (2006.01) |
| H01L 21/48 | (2006.01) |
| H05K 1/03 | (2006.01) |
| H01L 23/467 | (2006.01) |
| H01L 23/473 | (2006.01) |
| H01L 23/498 | (2006.01) |

(52) U.S. Cl.
CPC ......... *H05K 1/021* (2013.01); *H01L 21/4882* (2013.01); *H01L 23/31* (2013.01); *H01L 23/3735* (2013.01); *H05K 3/32* (2013.01); *H01L 23/467* (2013.01); *H01L 23/473* (2013.01); *H01L 23/49833* (2013.01); *H01L 2924/0002* (2013.01); *H05K 1/0203* (2013.01); *H05K 1/0306* (2013.01); *Y10T 29/4913* (2015.01); *Y10T 29/49146* (2015.01)

(58) Field of Classification Search
CPC ......... H05K 1/021; H05K 3/32; H05K 1/0306
USPC ........ 174/252, 520, 521, 548; 361/728, 688, 361/690, 697, 701–703, 709
See application file for complete search history.

(56) References Cited

U.S. PATENT DOCUMENTS

| | | | | |
|---|---|---|---|---|
| 6,309,737 | B1* | 10/2001 | Hirashima et al. | 428/210 |
| 8,609,993 | B2* | 12/2013 | Kuromitsu et al. | 174/256 |
| 2002/0109152 | A1* | 8/2002 | Kobayashi et al. | 257/177 |
| 2006/0254762 | A1* | 11/2006 | Tao et al. | 165/177 |
| 2008/0079021 | A1* | 4/2008 | Bayerer et al. | 257/177 |
| 2008/0101013 | A1* | 5/2008 | Nelson et al. | 361/689 |
| 2009/0056996 | A1* | 3/2009 | Kato et al. | 174/260 |

(Continued)

FOREIGN PATENT DOCUMENTS

| | | |
|---|---|---|
| CN | 101401197 A | 4/2009 |
| DE | 102011089886 A1 | 2/2013 |

*Primary Examiner* — Hoa C Nguyen
(74) *Attorney, Agent, or Firm* — Viering, Jentschura & Partner mbB

(57) ABSTRACT

In various embodiments, a substrate is provided. The substrate may include: a ceramic carrier having a first side and a second side opposite the first side; a first metal layer disposed over the first side of the ceramic carrier; a second metal layer disposed over the second side of the ceramic carrier; and a cooling structure formed into or over the second metal layer.

17 Claims, 11 Drawing Sheets

(56) References Cited

U.S. PATENT DOCUMENTS

| | | | |
|---|---|---|---|
| 2009/0080187 A1* | 3/2009 | Chou | 362/231 |
| 2011/0053319 A1* | 3/2011 | Hohlfeld et al. | 438/121 |
| 2013/0134572 A1* | 5/2013 | Lenniger et al. | 257/690 |
| 2013/0285234 A1* | 10/2013 | Uhlemann et al. | 257/712 |

* cited by examiner

SUBSTRATE, CHIP ARRANGEMENT, AND METHOD FOR MANUFACTURING THE SAME

TECHNICAL FIELD

Various embodiments relate generally to a substrate, a chip arrangement, and a method for manufacturing the same.

BACKGROUND

Substrates in power electronics usually provide interconnections for forming an electric circuit (e.g. a printed circuit board), as well as, for heat dissipation from the components. In comparison to materials and technologies used for lower power microelectronics, power electronic substrates should provide higher current capacity and higher voltage isolation which might be voltages up to several thousand volts. Furthermore, these power electronic substrates also should operate over a wide temperature range, such as up to about 150° C. or even 200° C.

One substrate of the conventionally used substrates is the direct bonded copper (DBC) substrate which is commonly used in power electronic modules due to their high thermal conductivity. The DBCs are usually composed of a ceramic tile conventionally manufactured of a metal oxide or nitride (e.g. aluminum oxide, aluminum nitride, and the like) with at least one layer (e.g. with at least one metal sheet or metal foil) of copper bonded to one or both sides of the ceramic tile by means of a high-temperature oxidation process, wherein the one or more copper layers and substrate are heated to a controlled temperature in an nitrogen atmosphere. Under these conditions, a copper-oxygen eutectic is formed which bonds to the one or more copper layers and the oxides used as a substrate such that a common substrate is formed. The top copper layer can be prefabricated, such as by means of a heat treatment, an ablation process and/or etching using a conventional printed circuit board technology to form an electrical circuit, while the bottom copper layer is usually kept plain. Conventionally, the substrate is attached to a heat spreader by means of soldering the bottom copper layer to the substrate. Moreover, conventional ceramic material used in DBC substrates include typically metal oxides or nitrides, such as alumina (aluminum oxide, $Al_2O_3$), which is widely used because of its low cost, but alumina has however low thermal conductivity (about 24 W/mK to about 28 W/mK) and is highly brittle; aluminum nitride (AlN), which is more expensive, but has a better thermal performance (about 150 W/mK to about 230 W/mK); and beryllium oxide (BeO), which has an improved thermal performance (about 330 W/mK), but is often avoided, because of its high toxicity when the powder is ingested or inhaled. One characteristic of the DBC substrates is their low coefficient of thermal expansion, which is close to that of silicon (compared to pure copper). This characteristic ensures good thermal cycling performances (up to about 50,000 cycles). The DBC substrates also have excellent electrical insulation and good heat spreading characteristics. A related technique uses a seed layer, photoimaging, and then additional copper plating to allow for fine lines (as small as 50 µm) and through-vias to connect front and back sides. This can be combined with polymer-based circuits to create high density substrates that eliminate the requirement for direct connection of power devices to heat sinks.

Currently, there are substantially two approaches for providing heat dissipation by the power electronic substrates. On the one hand, the module is mounted to an external radiator by a thermal heat sink paste, wherein this arrangement has a low thermal conductivity, and on the other hand the module is built up on a so called PinFin plate (i.e. the structure on such a plate is a combination of a pin structure and fin structure formed on one side of the plate) which can be water cooled, such as by means of soldering of the DBC onto this plate, wherein the high material costs for this kind of plates and the still low heat transfer due to the intermediate layer of solder and the thickness of the PinFin plate may be disadvantageous. Moreover, such plates usually allow solely heat dissipation in one direction from the power module, such as the top side or the bottom side of the module.

SUMMARY

A substrate is provided. The substrate may include: a ceramic carrier having a first side and a second side opposite the first side; a first metal layer disposed over the first side of the ceramic carrier; a second metal layer disposed over the second side of the ceramic carrier; and a cooling structure formed into or over the second metal layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The substrate, the chip arrangement and the method for manufacturing the same described within the present disclosure may provide a power electronic substrate having an improved heat dissipation behavior. The improved heat dissipation may be achieved by forming into or over at least one of the metallized sides of the substrate a cooling structure. The cooling structure may be formed in order to achieve an increased surface on this side of the substrate for improving heat dissipation. Moreover, the cooling structure formed into or over the at least one side of the substrate may be formed into or over at least one of the external metal lamination (or lining) of the substrate. By way of example, either the cooling structure may be formed into the external metal lamination by means of e.g. an etching process (e.g. dry etching, wet etching, plasma etching), laser ablation, mechanical sawing, or milling, and the like, or the cooling structure may be formed over the external metal lamination by means of e.g. bonding (e.g. wire bonding), welding, soldering, or structured deposition, and the like. Therefore, an improved and more cost-efficient heat dissipation may be achieved due to the cooling structure at the surface of the substrate by means of omitting a further heat dissipation module. Furthermore, the pre-structured substrate, having a cooling structure formed on at least one side a side, may be formed at one or both sides of the power electronic, wherein this arrangement may allow direct fluid cooling of the substrate either on one side or both sides due to the internal structure of the module, i.e. single-sided or double-sided fluid cooling may be achievable, for cooling these power electronics. Thus, such a substrate, a chip arrangement, and a method for manufacturing the same herein described may achieve improved heat dissipation and an increased cost-efficiency of the final products.

Figure 1A:
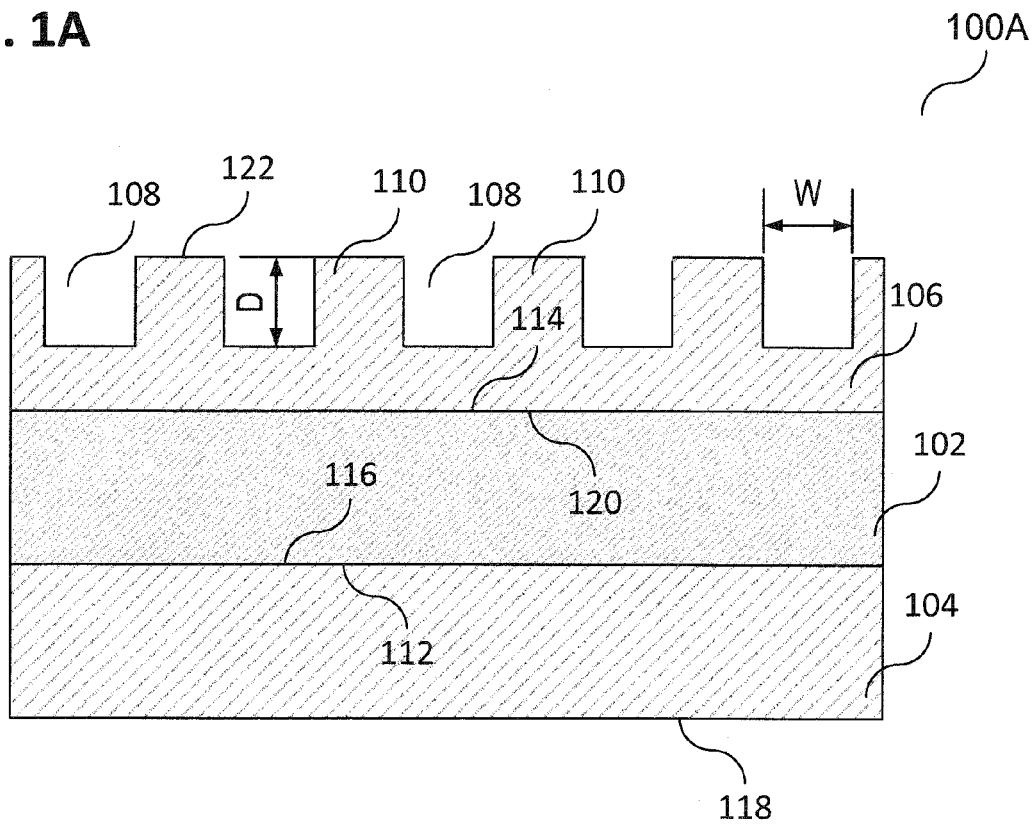
FIGS. 1A and 1B show a cross-sectional view of a substrate according to various embodiments.

FIG. 1A shows a cross-sectional view of a substrate 100A according to various embodiments. The substrate 100A may include: a ceramic carrier 102 having a first side (in other words a first main surface, which may also be referred to as front side or front surface) 112 and a second side (in other words a second main surface, which may also be referred to as back side or back surface) 114 opposite the first side 112; a first metal layer 104 disposed over the first side 112 of the ceramic carrier 102; a second metal layer 106 disposed over the second side 114 of the ceramic carrier 102; and a cooling structure 110 formed into the second metal layer 106.

The ceramic carrier 102 may be formed from at least one of the group of ceramic carrier materials, wherein the group of ceramic carrier materials may include or consist of: alumina (aluminum oxide, $Al_2O_3$), aluminum nitride (AlN), beryllium oxide (BeO), and the like. Furthermore, the ceramic carrier material may be an insulating ceramic material.

The ceramic carrier 102 may have a thickness, wherein the thickness may be a distance extending between the first side 112 and the second side 114 of the ceramic carrier 102. The thickness of the ceramic carrier 102 may be in the range from about 100 μm to about 2 mm, e.g. in the range from about 0.25 mm to about 1 mm.

The ceramic carrier 102 may be formed such that the ceramic carrier 102 may have at least one of the group of geometrical body shapes, wherein the group of geometrical body shapes may include or consist of: a cube, a cuboid, a cylinder, a parallelepiped, a prism, and the like.

The ceramic carrier 102 may be formed such that the ceramic carrier 102 may have a footprint of at least one of the group of geometrical footprint shapes, wherein the group of geometrical footprint shapes may include or consist of: a circle, a square, a rectangle, a rhombus, a trapezoidal, a parallelogram, a triangle, an ellipse, a pentagon, a hexagon, a heptagon, an octagon, a nonagon, a polygon, and the like.

The footprint of the ceramic carrier 102 may be in the range from about 1 $mm^2$ to about 300 $cm^2$, e.g. in the range from about 0.25 $cm^2$ to about 25 $cm^2$, e.g. in the range from about 1 $cm^2$ to about 25 $cm^2$.

The ceramic carrier 102 may be formed by means of a common heat treatment (e.g. sintering) for manufacturing ceramics from at least one of the following materials: alumina (aluminum oxide, $Al_2O_3$), aluminum nitride (AlN), or beryllium oxide (BeO).

In various embodiments, the ceramic carrier 102 may be formed as a ceramic tile.

In various embodiments, the ceramic carrier 102 may be formed such that the ceramic carrier 102 may have a larger footprint than at least one of the metal layers, 104 and/or 106, disposed subsequently over the ceramic carrier 102 as will be described in more detail below.

In various embodiments, the ceramic carrier 102 may be formed such that the footprint of the ceramic carrier 102 may have the same footprint as at least one of the metal layers, 104 and/or 106, disposed subsequently over the ceramic carrier 102 as will be described in more detail below.

The first metal layer 104 may be disposed at least partially over the first side 112 of the ceramic carrier 102.

The first metal layer 104 may be formed from at least one of the group of metals, wherein the group of metals may include of consist of: copper (Cu), aluminum (Al), nickel (Ni), gold (Au), silver (Ag), palladium (Pd), platinum (Pt), copper alloys, aluminum alloys, nickel alloys, gold alloys, silver alloys, palladium alloys, platinum alloys, and the like.

The first metal layer 104 having a first side 118 and a second side 116 opposite the first side 118 may have a thickness, wherein the thickness may be a distance extending between the first side 118 and the second side 116 of the first metal layer 104. The thickness of the first metal layer 104 may be in the range from about 0.01 mm to about 1 mm, e.g. in the range from about 0.1 mm to about 0.5 mm, e.g. in the range from about 0.1 mm to about 1 mm.

The first metal layer 104 may be formed such that the first metal layer 104 may have at least one of the group of geometrical body shapes, wherein the group of geometrical body shapes may include or consist of: a cube, a cuboid, a cylinder, a parallelepiped, a prism, and the like.

The first metal layer 104 may be formed such that the first metal layer 104 may have a footprint of at least one of the group of geometrical footprint shapes, wherein the group of geometrical footprint shapes may include or consist of: a circle, a square, a rectangle, a rhombus, a trapezoidal, a parallelogram, a triangle, an ellipse, a pentagon, a hexagon, a heptagon, an octagon, a nonagon, a polygon, and the like.

The footprint of the first metal layer 104 may be in the range from about 1 $mm^2$ to about 300 $cm^2$, e.g. in the range from about 0.25 $cm^2$ to about 25 $cm^2$, e.g. in the range from about 1 $cm^2$ to about 25 $cm^2$.

In various embodiments, the first metal layer 104 may be prefabricated such that the first metal layer 104 may be formed by means of one or more metal sheets or metal foils, such as by means of a plurality of metal sheets or metal foils, wherein the individual elements of the plurality of metal sheets or metal foils may be disposed such that the individual elements of the plurality of metal sheets or metal foils may be stacked one above another and may be formed from at least one of the metals described above.

In various embodiments, the first metal layer 104 may be disposed (e.g. by means of attaching or bonding) at least partially over the first side 112 of the ceramic carrier 102, wherein the first side 112 of the ceramic carrier 102 may be formed at least partially adjacent to the second side 116 of the first metal layer 104. Further, the first metal layer 104 and the second metal layer 106 may be disposed at least partially over the first side 112 and the second side 114, respectively, by means of a common process as will be described in more detail further below.

In various embodiments, the first metal layer 104 may be formed such that the first metal layer 104 may be substantially a planar (or flat) metal layer. In other words, the first metal layer 104 may be an unstructured metal layer.

In various embodiments, the first metal layer 104 may be formed such that the first metal layer 104 may have one or more electronic structures or structured elements formed into the first metal layer 104. These electronic structures may be formed by means of a common process such as heat treatment, deposition, patterning, and the like.

In various embodiments, the first metal layer 104 may be formed such that the first metal layer 104 may serve at least partially as a back side metallization for at least one chip or die which may be attached subsequently to the first metal layer 104.

The second metal layer 106 may be disposed at least partially over the second side 114 of the ceramic carrier 102.

The second metal layer 106 may be formed from at least one of the group of metals, wherein the group of metals may include of consist of: copper (Cu), aluminum (Al), nickel (Ni), gold (Au), silver (Ag), palladium (Pd), platinum (Pt), copper alloys, aluminum alloys, nickel alloys, gold alloys, silver alloys, palladium alloys, platinum alloys, and the like.

The second metal layer 106 having a first side 120 and a second side 122 opposite the first side 120 may have a thickness, wherein the thickness may be a distance extending between the first side 120 and the second side 122 of the second metal layer 106. The thickness of the second metal layer 106 may be in the range from about 0.01 mm to about 1 mm, e.g. in the range from about 0.1 mm to about 0.5 mm, e.g. in the range from about 0.1 mm to about 1 mm.

The second metal layer 106 may be formed such that the second metal layer 106 may have at least one of the group of geometrical body shapes, wherein the group of geometrical body shapes may include or consist of: a cube, a cuboid, a cylinder, a parallelepiped, a prism, and the like.

The second metal layer 106 may be formed such that the second metal layer 106 may have a footprint of at least one of the group of geometrical footprint shapes, wherein the group of geometrical footprint shapes may include or consist of: a circle, a square, a rectangle, a rhombus, a trapezoidal, a parallelogram, a triangle, an ellipse, a pentagon, a hexagon, a heptagon, an octagon, a nonagon, a polygon, and the like.

The footprint of the second metal layer 106 may be in the range from about 1 $mm^2$ to about 300 $cm^2$, e.g. in the range from about 0.25 $cm^2$ to about 25 $cm^2$, e.g. in the range from about 1 $cm^2$ to about 25 $cm^2$.

In various embodiments, the second metal layer 106 may be prefabricated such that the second metal layer 106 may be formed by means of one or more metal sheets or metal foils, such as by means of a plurality of metal sheets or metal foils, wherein the individual elements of the plurality of metal sheets or metal foils may be disposed such that the individual elements of the plurality of metal sheets or metal foils may be stacked one above another and may be formed from at least one of the metals described above.

The second metal layer 106 may be disposed at least partially (e.g. by means of attaching or bonding) over the second side 114 of the ceramic carrier 102, wherein the second side 114 of the ceramic carrier 102 may be formed at least partially adjacent to the first side 120 of the second metal layer 106.

The first metal layer 104 and the second metal layer 106 may be disposed at least partially over the first side 112 and the second side 114, respectively. The first metal layer 104 and the second metal layer 106 may be bonded by means of a conventional common heat treatment process, e.g. by means of a common bonding process using the eutectic melting of the materials which may be employed within the process in a gas atmosphere (e.g. nitrogen, and the like), for bonding at least one of the metal layers described above to at least one of the ceramic materials described above of the ceramic carrier 102.

In various embodiments, the cooling structure may be formed subsequently into the second side 122 of the second metal layer 106. The cooling structure may be formed by means of forming a plurality of trenches (or recesses or slots) 108 which may form a plurality of either pins 110, fins 110, or a combination of pins and fins 110. The cooling structure formed from the plurality of either pins 110, fins 110, or a combination of pins and fins 110 may be referred to as a PinFin structure 110 in the following description. In other words, the terms PinFin structure 110 and cooling structure, which may be formed from a plurality of pins (e.g. a pin structure) 110, a plurality of fins (e.g. a fin structure) 110, or a combination of a pin structure 110 and a fin structure 110, may be used synonymously herein. The PinFin structure 110 may be formed by means of forming a plurality of trenches (or recesses, slots, and the like) 108 having a predetermined depth D and a predetermined width W into the second side 122 of the second metal layer 106.

The plurality of trenches (or recesses, slots, and the like) 108 may be formed into the second side 122 of the second metal layer 106 by at least one of the group of trench forming methods, wherein the group of trench forming methods may include or consist of: etching (e.g. dry and wet etching), plasma etching, laser ablation, mechanical sawing, milling, and the like.

Each trench of the plurality of trenches 108 may be formed between the PinFin structure 110 such that the trenches 108 may have at least one of the group of geometrical cross-sectional shapes, wherein the group of geometrical cross-sectional shapes may include or consist of: semi-circle, a semi-ellipse, a triangle, a square, a rectangle, a trapazoid, a polygon, and the like.

Each trench of the plurality of trenches 108 may be formed between the PinFin structure 110 such that the trenches 108 may have a predetermined depth D, wherein the depth D may be in the range from about 0.01 mm to about 1 mm, e.g. in the range from about 0.1 mm to about 0.5 mm, e.g. in the range from about 0.1 mm to about 1 mm.

Each trench of the plurality of trenches 108 may be formed between the PinFin structure 110 such that the trenches 108 may have a predetermined width W extending between two elements of the PinFin structure 110, wherein the width W may be in the range from about 0.01 mm to about 2 mm, e.g. in the range from about 0.1 mm to about 0.5 mm, e.g. in the range from about 0.1 mm to about 1 mm.

The plurality of trenches 108 may define the PinFin structure 110 by means of the depth D and width W of the plurality of trenches 108 formed into the second side 122 of the second metal layer 106.

Each element of the PinFin structure 110 may be formed such that each element of the PinFin structure 110 may have a footprint. The footprint of the elements of the PinFin structure 110 may be at least one of the group of geometrical footprint shapes, wherein the group of geometrical footprint shapes may include or consist of: a circle, a square, a rectangle, a rhombus, a trapezoidal, a parallelogram, a triangle, an ellipse, a pentagon, a hexagon, a heptagon, an octagon, a nonagon, a polygon, and the like.

The footprint of each element of the PinFin structure 110 may be formed such that the area of the footprint may be in the range from about 0.01 mm$^2$ to about 5 mm$^2$, e.g. in the range from about 0.05 mm$^2$ to about 0.5 mm$^2$, e.g. in the range from about 0.1 mm$^2$ to about 0.5 mm$^2$.

Each element of the PinFin structure 110 may be formed such that each element of the PinFin structure 110 may have a body shape. The body shape of each element of the PinFin structure 110 may be at least one of the group of geometrical body shapes, wherein the group of geometrical body shapes may include or consist of: a cube, a cuboid, a cylinder, a parallelepiped, a prism, and the like.

In various embodiments, the PinFin structure 110 may be formed such that the elements of the PinFin structure 110 may be disposed at least partially as an array on the second side 122 of the second metal layer 106.

In various embodiments, the PinFin structure 110 may be formed such that the elements of the PinFin structure 110 may be arranged in rows on the second side 122 of the second metal layer 106, wherein each row may be arranged with an offset to each other, such as an offset of brickwork.

In various embodiments, the PinFin structure 110 may be formed such that the elements of the PinFin structure 110 may form a superstructure on the second side 122 of the second metal layer 106, wherein such a superstructure may form a geometrical arrangement by means of the elements of the PinFin structure 106 disposed at the corners of such a geometrical arrangement. The arrangement of the elements of the PinFin structure 106 may be at least one of the group of geometrical arrangements, wherein the group or geometrical arrangements may include or consist of: a circle, a square, a rectangle, a rhombus, a trapezoidal, a parallelogram, a triangle, an ellipse, a pentagon, a hexagon, a heptagon, an octagon, a nonagon, a polygon, and the like.

Moreover, the geometrical arrangements of the elements of the PinFin structure 106 may be formed by superimposing the geometrical arrangements described above on the second side 120 of the second metal layer 106.

In various embodiments, the various arrangements described above may be combined forming a variety of PinFin structures arrangements 110.

Figure 1B:
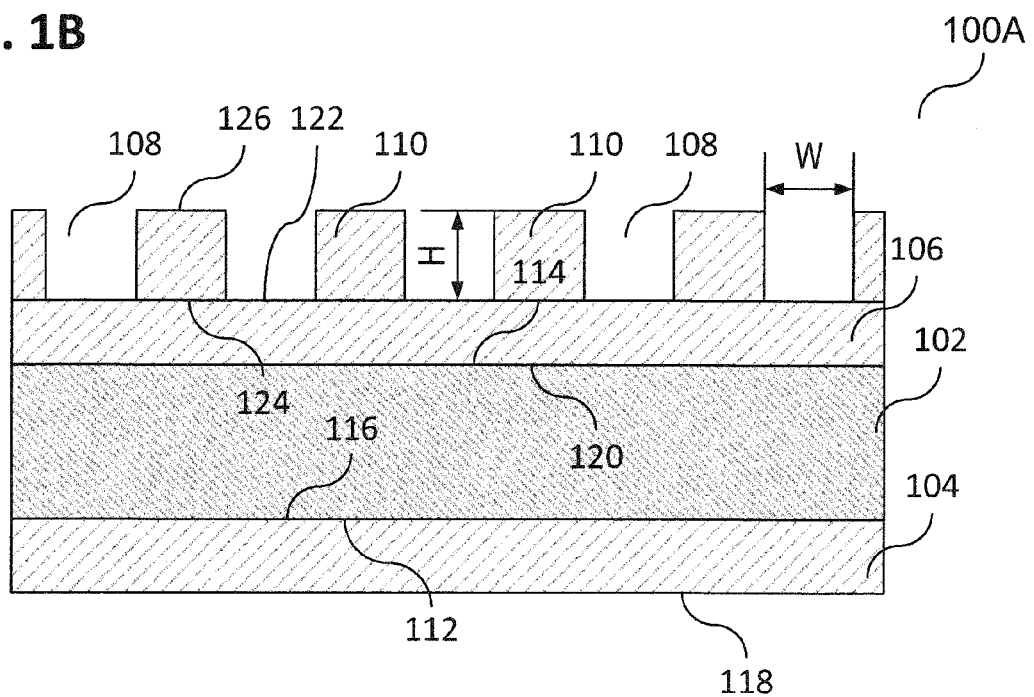

FIG. 1B shows a cross-sectional view of a substrate 100B according to various embodiments. The substrate 100A may include: a ceramic carrier 102 having a first side 112 and a second side 114 opposite the first side 112; a first metal layer 104 disposed over the first side 112 of the ceramic carrier 102; a second metal layer 106 disposed over the second side 114 of the ceramic carrier 102; and a cooling structure 110 formed over the second metal layer 106.

The substrate 100B may be formed similar as the substrate 100A shown in FIG. 1A as described above. Furthermore, the individual elements of the substrate 100B may be formed from similar materials as the elements of the substrate 100A shown in FIG. 1A as described above.

The substrate 100B may be formed such that both metal layers, first metal layer 104 and the second metal layer 106, may be formed substantially as planar (or flat) layers.

In various embodiments, the PinFin structure 110 may be formed over the second side 122 of the second metal 106. Each element of the PinFin structure 110 having a first side 124 and a second side 126 opposite the first side 124 may be formed over the second side 122 of the second metal 106 such that the individual elements of the PinFin structure 110 may be separated from each other by a predetermined width W formed between them. Each element of the PinFin structure 110 may be formed such that each element of the PinFin structure 110 may have a predetermined height H.

The width W of the elements of the PinFin structure 110 may be in the range from about 0.01 mm to about 2 mm, e.g. in the range from about 0.1 mm to about 0.5 mm, e.g. in the range from about 0.1 mm to about 1 mm.

The height H of the elements of the PinFin structure 110 may be in the range from about 0.01 mm to about 1 mm, e.g. in the range from about 0.1 mm to about 0.5 mm, e.g. in the range from about 0.1 mm to about 1 mm.

Each element of the PinFin structure 110 may be formed such that each element of the PinFin structure 110 may have a footprint. The footprint may be at least one of the group of geometrical footprint shapes, wherein the group of geometrical footprint shapes may include or consist of: a circle, a square, a rectangle, a rhombus, a trapezoidal, a parallelogram, a triangle, an ellipse, a pentagon, a hexagon, a heptagon, an octagon, a nonagon, a polygon, and the like.

The footprint of each element of the PinFin structure 110 may be formed such that the area of the footprint may be in the range from about 0.01 mm$^2$ to about 5 mm$^2$, e.g. in the range from about 0.05 mm$^2$ to about 0.5 mm$^2$, e.g. in the range from about 0.1 mm$^2$ to about 0.5 mm$^2$.

Each element of the PinFin structure 110 may be formed such that each element of the PinFin structure 110 may have a body shape. The body shape may be at least one of the group of geometrical body shapes, wherein the group of geometrical body shapes may include or consist of: a cube, a cuboid, a cylinder, a parallelepiped, a prism, and the like.

The elements of the PinFin structure 110 may be disposed at least partially over the second side 120 of the second metal layer 106, wherein the first side 124 of each element of the PinFin structure 110 may be disposed at least partially adjacent to the second side 122 of the second metal layer 106. The elements of the PinFin structure 110 may be attached at least partially to the second side 122 of the second metal layer 106 by means of at least one of the group of attaching methods, wherein the group of attaching methods may include or consist of: bonding (e.g. wire bonding), welding, soldering, structured deposition, and the like.

Structured deposition may be employed by means of at least one of the group of deposition methods, wherein the group of deposition methods may include or consist of: electroplating, galvanizing, plating, and the like.

Figure 2:
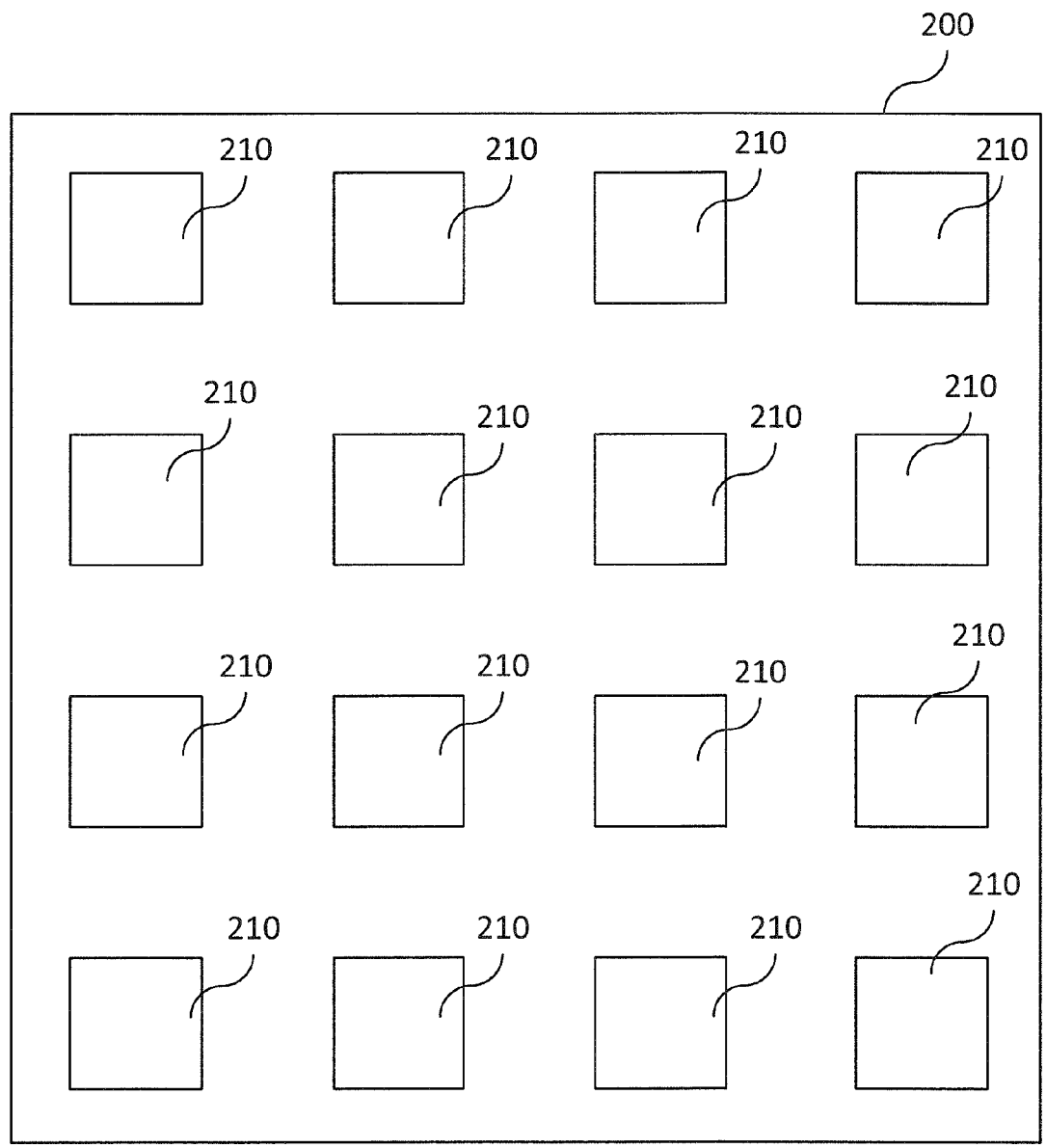
FIG. 2 shows a top view of a substrate according to various embodiments.

FIG. 2 shows a top view of a substrate 200 according to various embodiments. The substrate 200 may be formed similar to at least one of the substrates 100A or 100B.

The elements of the PinFin structure 210 of the substrate 200 may be formed such that the PinFin structure 210 may be disposed at least partially into or over the second side of the second metal layer having an array structure.

In various embodiments, the elements of the PinFin structure 210 may be formed such that the elements of the PinFin structure 210 may have a square shaped footprint.

The elements of the PinFin structure 210 may be arranged in any desired regular or irregular pattern along the surface of the substrate 200. The elements of the PinFin structure 210 may be arranged in any desired (same or different) distances from each other.

Figure 3:
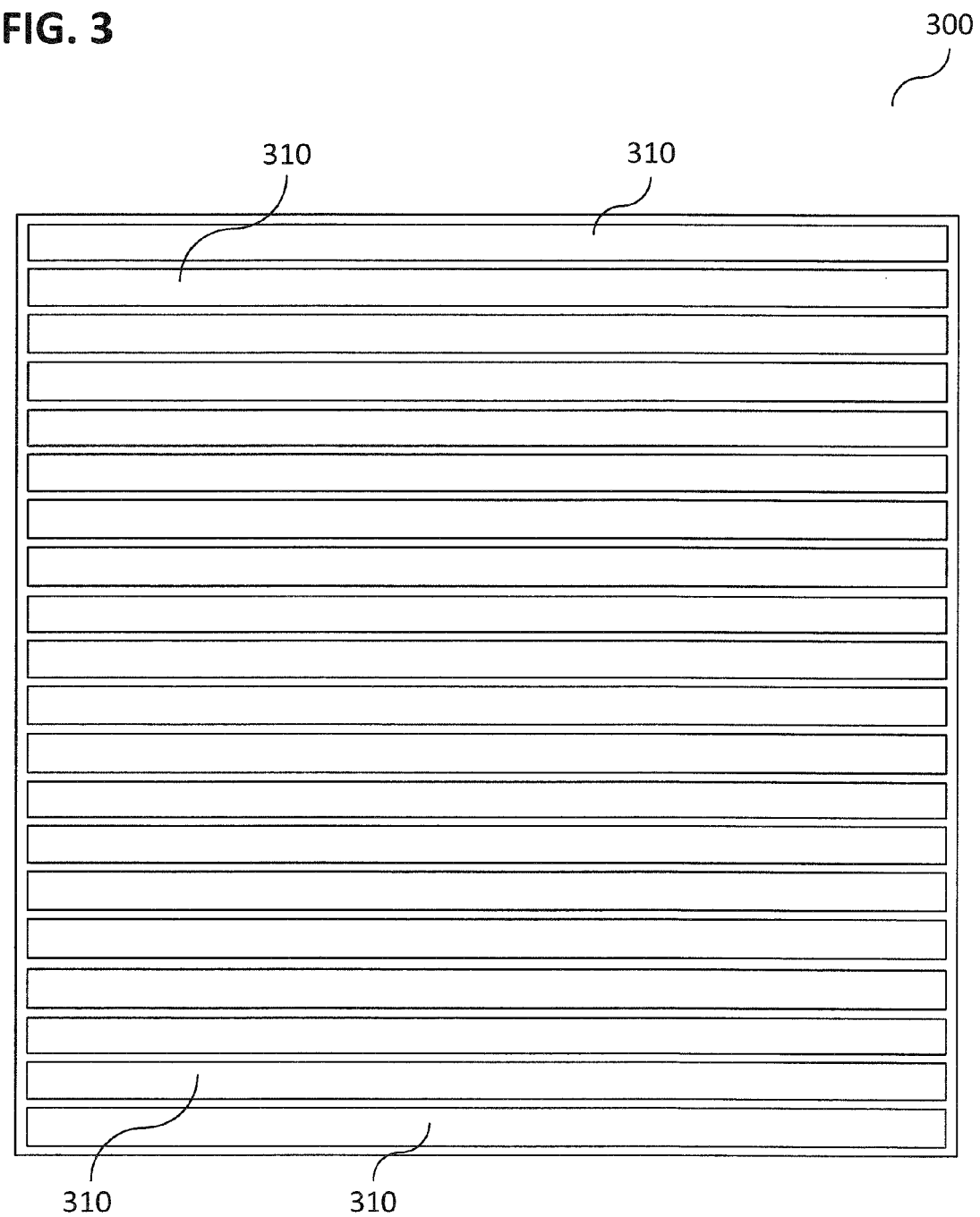
FIG. 3 shows a top view of a substrate according to various embodiments.

FIG. 3 shows a top view of a substrate 300 according to various embodiments. The substrate 300 may be formed similar to at least one of the substrates 100A or 100B.

The elements of the PinFin structure 310 of the substrate 300 may be formed such that the PinFin structure 310 may be disposed at least partially into or over the second side of the second metal layer having a fin structure.

In various embodiments, the elements of the PinFin structure 310 may be formed such that the elements of the PinFin structure 310 may have a rectangular shaped footprint. The elements of the PinFin structure 310 may be arranged in any desired (same or different) distance(s) from each other.

Figure 4:
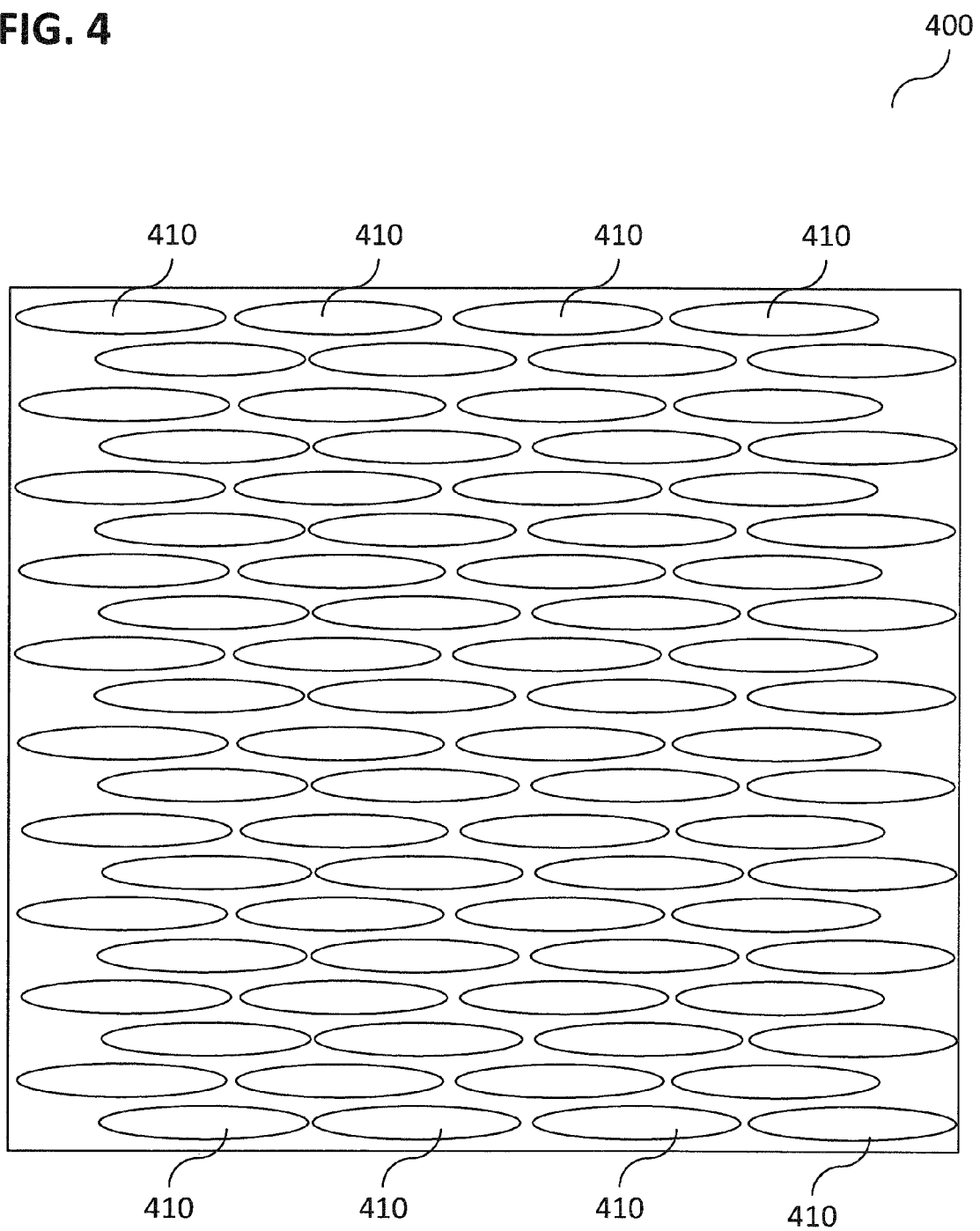
FIG. 4 shows a top view of a substrate according to various embodiments.

FIG. 4 shows a top view of a substrate 400 according to various embodiments. The substrate 400 may be formed similar to at least one of the substrates 100A or 100B.

The elements of the PinFin structure 410 of the substrate 400 may be formed such that the elements of the PinFin structure 410 may be disposed at least partially into or over the second side of the second metal layer having a PinFin structure.

In various embodiments, the elements of the PinFin structure 410 may be formed such that the elements of the PinFin structure 410 may have an elliptically shaped footprint. Moreover, the elliptically shaped elements of the PinFin structure 410 may be formed in rows on the second side of the second metal layer, wherein each row may be formed having an offset between each other, which may be similar formed to a offset of a brickwork.

Figure 5:
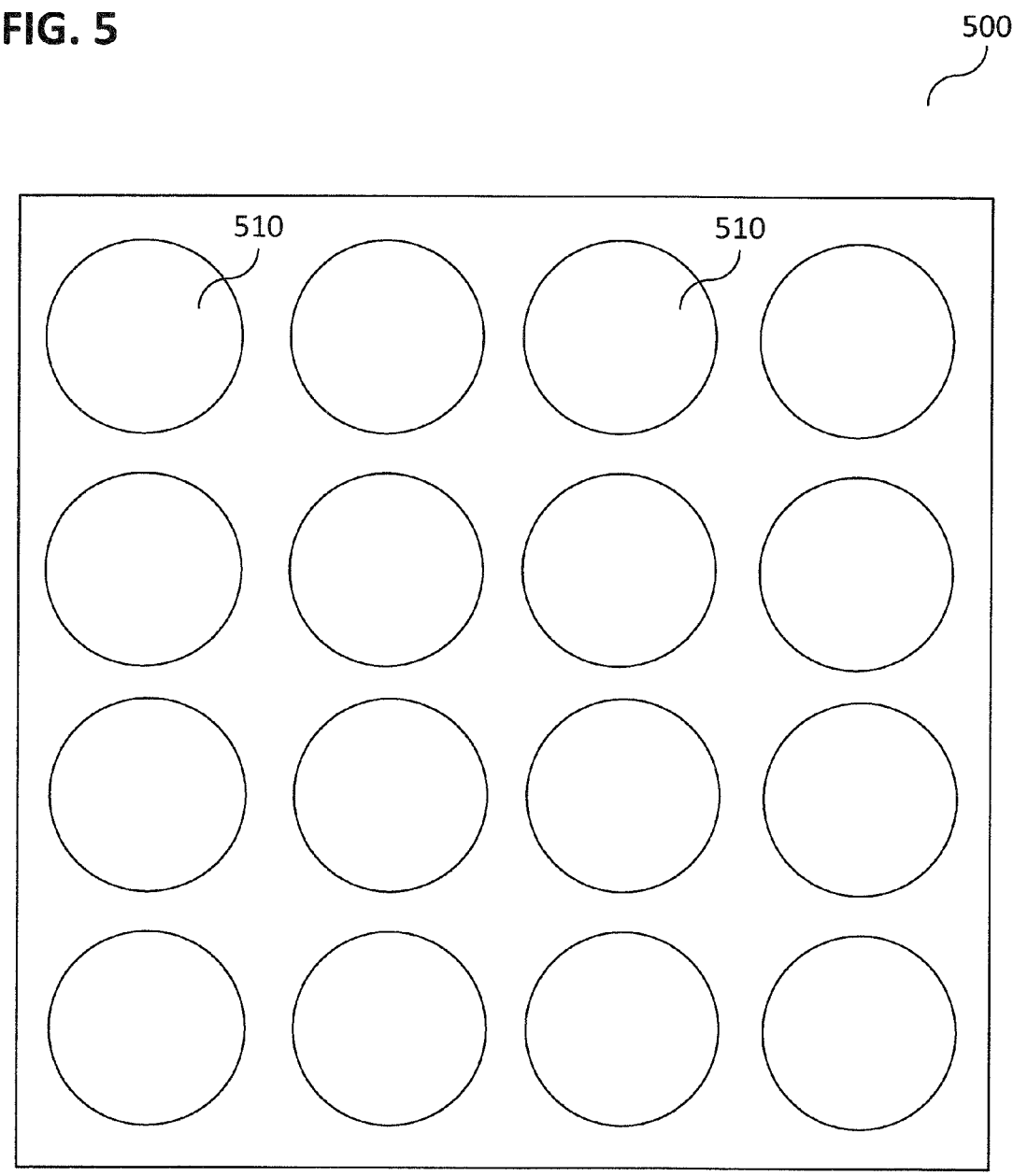
FIG. 5 shows a top view of a substrate according to various embodiments.

FIG. 5 shows a top view of a substrate 500 according to various embodiments. The substrate 500 may be formed similar to at least one of the substrates 100A or 100B.

The elements of the PinFin structure 510 of the substrate 500 may be formed such that the elements of the PinFin structure 510 may be disposed at least partially into or over the second side of the second metal layer having an array structure.

In various embodiments, the elements of the PinFin structure 510 may be formed such that the elements of the PinFin structure 510 may have a circular shaped footprint (with any desired diameter). The elements of the PinFin structure 310 may be arranged in any desired (same or different) distance(s) from each other.

Figure 6:
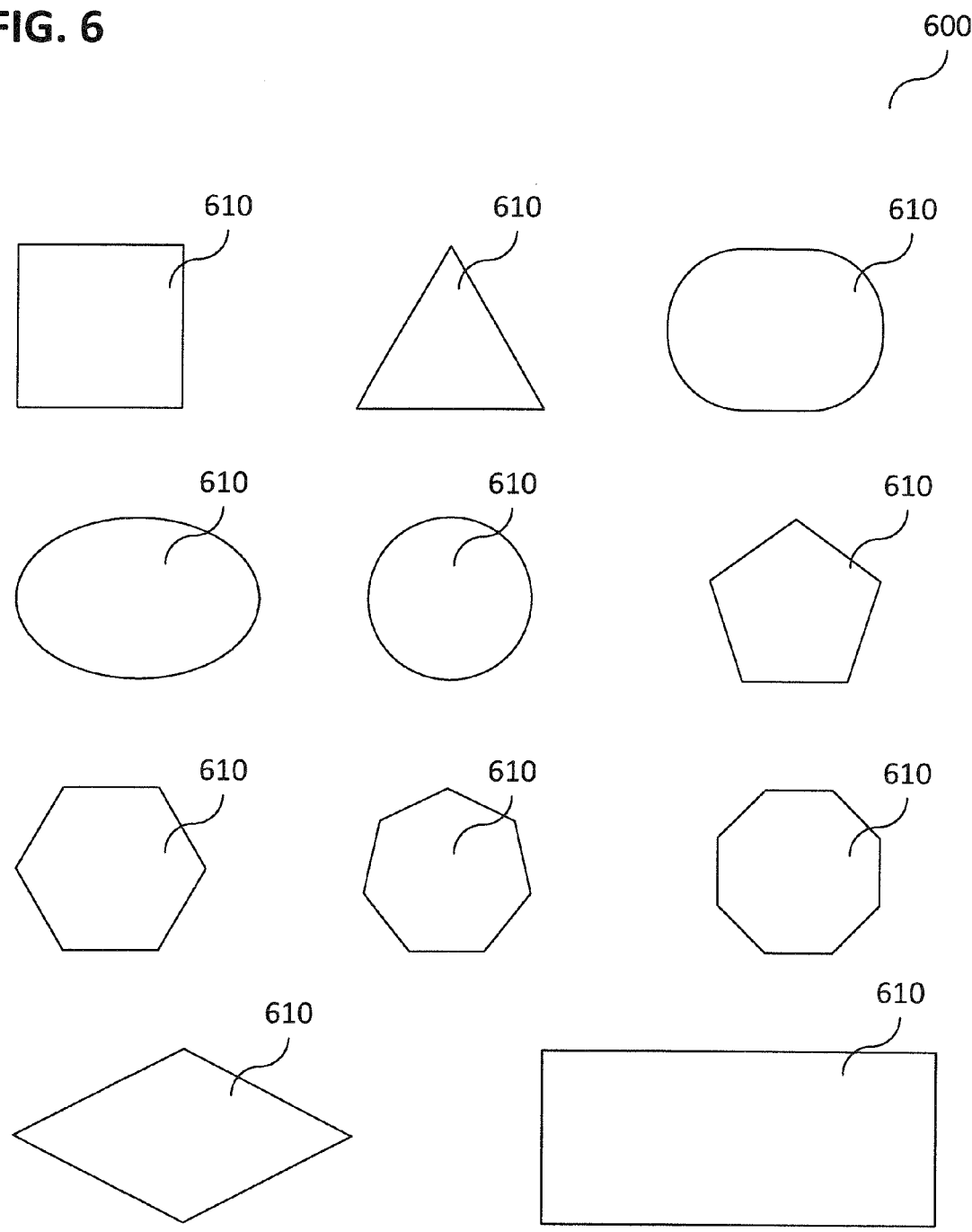
FIG. 6 shows a top view of various shaped pins and/or fins according to various embodiments.

FIG. 6 shows a top view of various footprint shapes of the elements of the PinFin structure 610 according to various embodiments. The elements of the PinFin structure 610 may be formed similar to at least one of the elements of the PinFin structure 110A or 110B as described above.

Although in FIG. 1 to FIG. 6, the respective PinFin structure is shown being formed by at least one uniformly shaped PinFin structure, it is understood, that the PinFin structures may be formed by one or more differently shaped structure elements (i.e. having different footprint shapes). The various footprint shapes of the respective elements of the PinFin structure 610 may be formed by at least one of the group of geometrical footprint shapes, wherein the group of geometrical footprint shapes may include or consist of: a square, a triangle, a rounded rectangle, an ellipse, a circle, a pentagon, an hexagon, an heptagon, an octagon, a rhombus, a rectangle, and the like.

Further, various PinFin structures may be formed by means of one or more shapes of the various footprint shapes.

In other words, over the second side of the second metal layer one or more differently shaped elements may be formed such that the variety of differently shaped elements may form a PinFin structure into or over the second side of the second metal layer.

Figure 7:
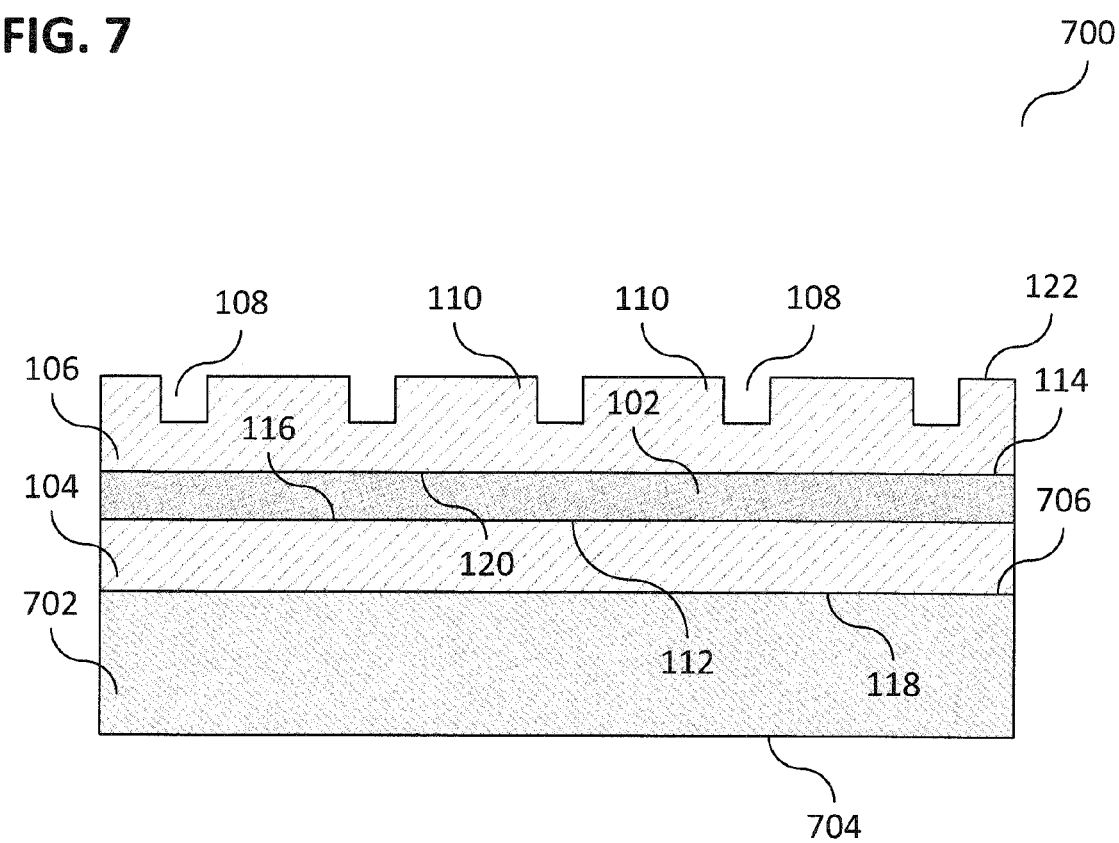
FIG. 7 shows a cross-sectional view of a chip arrangement according to various embodiments.

FIG. 7 shows a cross-sectional view of a chip arrangement 700 according to various embodiments.

The chip arrangement 700 may be formed by at least one chip (or at least one die) 702 having a first side 704 and a second side 706 opposite the first side 704' and a substrate which may be formed as described above. By way of examples, the substrate may be disposed over at least one of the first side 704 or the second side 706 of the at least one chip 702.

In various embodiments, the at least one chip 702 may be a wafer, a part of a wafer, a substrate, a part of a substrate, and the like, wherein the at least one chip 702 may be formed at least partially from at least one semiconductor material. The at least one chip 702 may further include at least one of a processed wafer, a processed substrate, and the like, wherein the processing may be at least one of the common processes, such as layer deposition, patterning, doping, and/or heat treatment.

The at least one chip 702 may be formed at least partially from at least one of the group of semiconductor materials, wherein the group of semiconductor materials may include or consist of: Silicon (Si), Silicon carbide (SiC), Silicon germanium (SiGe), Germanium (Ge), α-Tin (α-Sn), Boron (B), Selenium (Se), Tellurium (Te), Sulfur (S), Gallium phosphide (GaP), Gallium arsenide (GaAs), Indium phosphide (InP), Indium antimonide (InSb), Indium arsenide (InAs), Gallium antimonide (GaSb), Gallium nitride (GaN), Aluminum nitride (AlN), Indium nitride (InN), Aluminum gallium arsenide ($Al_xGa_{1-x}As$), and/or Indium gallium nitride ($In_xGa_{1-x}N$). Moreover, the one or more materials of the one or more semiconductor substrates may be one or more compound semiconductors from the group of compound semiconductors of the following groups of the periodic system: II-V, II-V, II-VI, I-VII, IV-VI and/or V-VI.

The at least one chip 702 may have a thickness, wherein the thickness of the at least one chip 702 may be a distance extending between the first side 704 and the second side 706 of the at least one chip 702. The thickness of the at least one chip 702 may be in the range from about 5 μm to about 5 mm, e.g. in the range from about 100 m to about 1 mm, e.g. in the range from about 50 μm to about 0.5 mm.

The at least one chip 702 may be formed such that at least one chip 702 may have a footprint which may be at least one of the group of geometrical footprint shapes, wherein the group of geometrical footprint shapes may include or consist of: a circle, a square, a rectangle, a rhombus, a trapezoidal, a parallelogram, a triangle, an ellipse, a pentagon, a hexagon, a heptagon, an octagon, a nonagon, a polygon, and the like.

The at least one chip 702 may be formed such that the at least one chip 702 may have footprint, wherein the footprint may have an area in the range from about 0.1 $mm^2$ to about 1000 $mm^2$, e.g. in the range from about 1 $mm^2$ to about 10 $mm^2$, e.g. in the range from about 0.5 $mm^2$ to about 25 $mm^2$.

The at least one chip 702 may be formed such that the at least one chip 702 may have body shape and the body shape may be at least one of the group of geometrical body shapes, wherein the group of geometrical body shapes may include or consist of: a cube, a cuboid, a cylinder, a parallelepiped, a prism, and the like.

Further, the chip arrangement 700 may include one or more chips 702, such as a plurality of chips 702.

The at least one chip 702 may be formed such that the at least one chip 702 may include one or more electronic component (or electronic structure and/or structured element and/or electronic device). The at least one electronic component may be formed by means of at least one common process, such as layer deposition, patterning, doping, and/or heat treatment.

The at least one electronic component may be formed such that the at least one electronic component may be at least one of the group of electronic components, wherein the group of electronic components may include or consist of: a diode, a transistor, a varistor, a bipolar junction transistor, junction gate field-effect transistor, a field effect transistor, a resistor, a capacitor, an inductor, a thyristor, a power transistor, a power metal oxide semiconductor (MOS) transistor, a power bipolar transistor, a power field effect transistor, a power insulated gate bipolar transistor (IGBT), a MOS controlled thyristors, a silicon controlled rectifier, a power schottky diode, a silicon carbide diode, a gallium nitride device, an ASIC, a driver, a controller, electronic filter combination, a LC link, a passive device, a sensor, and the like.

The substrate of the chip arrangement 700 including the ceramic carrier 102, the first metal layer 104, and the second metal layer 106, may be attached to the chip 702, wherein the second side 706 of the at least one chip 702 may be formed at least partially adjacent to the first side 118 of the second metal layer 104.

The substrate may be attached to the chip 702 by means of at least one of the group of attaching methods, wherein the group of attaching methods may include or consist of: bonding, welding, soldering, and the like.

The second side 122 of the second metal layer 106 may be exposed at least partially to the outside of the chip arrangement 700.

Figure 8:
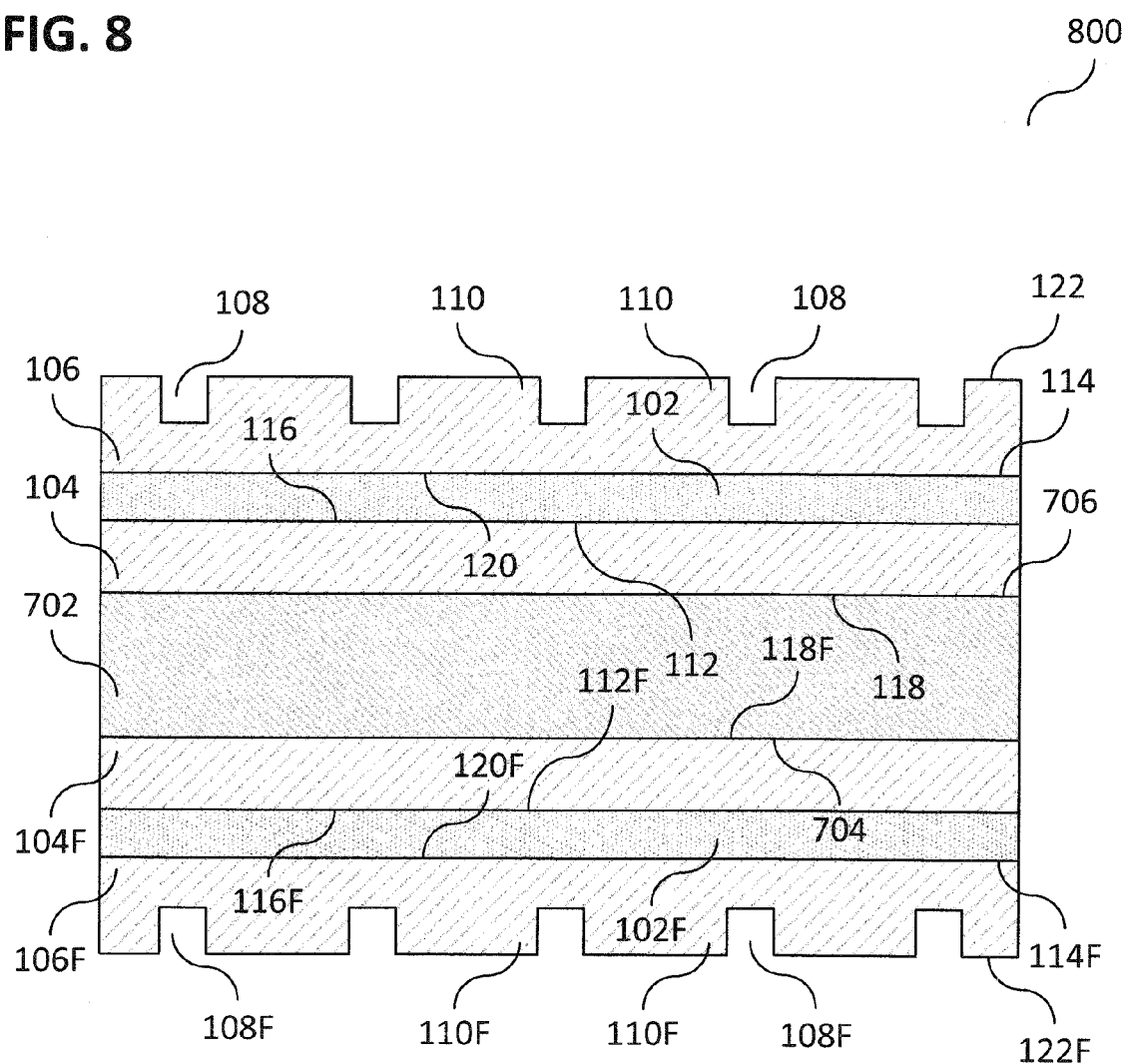
FIG. 8 shows a cross-sectional view of a chip arrangement according to various embodiments.

FIG. 8 shows a cross-sectional view of a chip arrangement 800 according to various embodiments. The chip arrangement 800 may include the chip arrangement 700 as described above.

Further, the chip arrangement 800 may include a further substrate including a ceramic carrier 102F having a first side 112F and a second side 114F opposite the first side 112F, a first metal layer 104F having a first side 116F and a second side 118F opposite the first side 116F, and a second metal layer 106F having a first side 120F and a second side 122F opposite the first side 120F.

The further substrate may be formed similar as the substrate 100A or the substrate 100B as described above. Thus, the further substrate may have plurality of trenches 108F and a PinFin structure 110F which may be formed similar to the substrate 100A or the substrate 100B as described above.

The further substrate of the chip arrangement 800 may be attached to the chip 702, wherein the first side 118F of the first metal layer 104F of the further substrate may attached at least partially adjacent to the first side 704 of the at least one chip 702

The further substrate may be attached to the chip 702 by means of at least one of the group of attaching methods, wherein the group of attaching methods may include or consist of: bonding, welding, soldering, and the like.

The at least one chip 702 may be sandwiched between the substrate and the further substrate.

The chip arrangement 800 may include one or more chips 702, such as a plurality of chips 702.

Further, the chip 702 may be disposed between the substrate and the further substrate, wherein e.g. a further layer (e.g. a further layer for an improved heat dissipation from at least one side of the chip) or a further electronic device may be disposed over at least one side of the both sides, the first side 704 and/or the second side 706 of the at least one chip 702, such that the further layer or further electronic device may be disposed between the at least one chip 702 and/or the first metal layer 104 of the substrate or the first metal layer 104F of the further substrate. In other words, further layers and/or devices may be disposed between at least one of the both substrates and the chip 702 of the chip arrangement 800.

Figure 9:
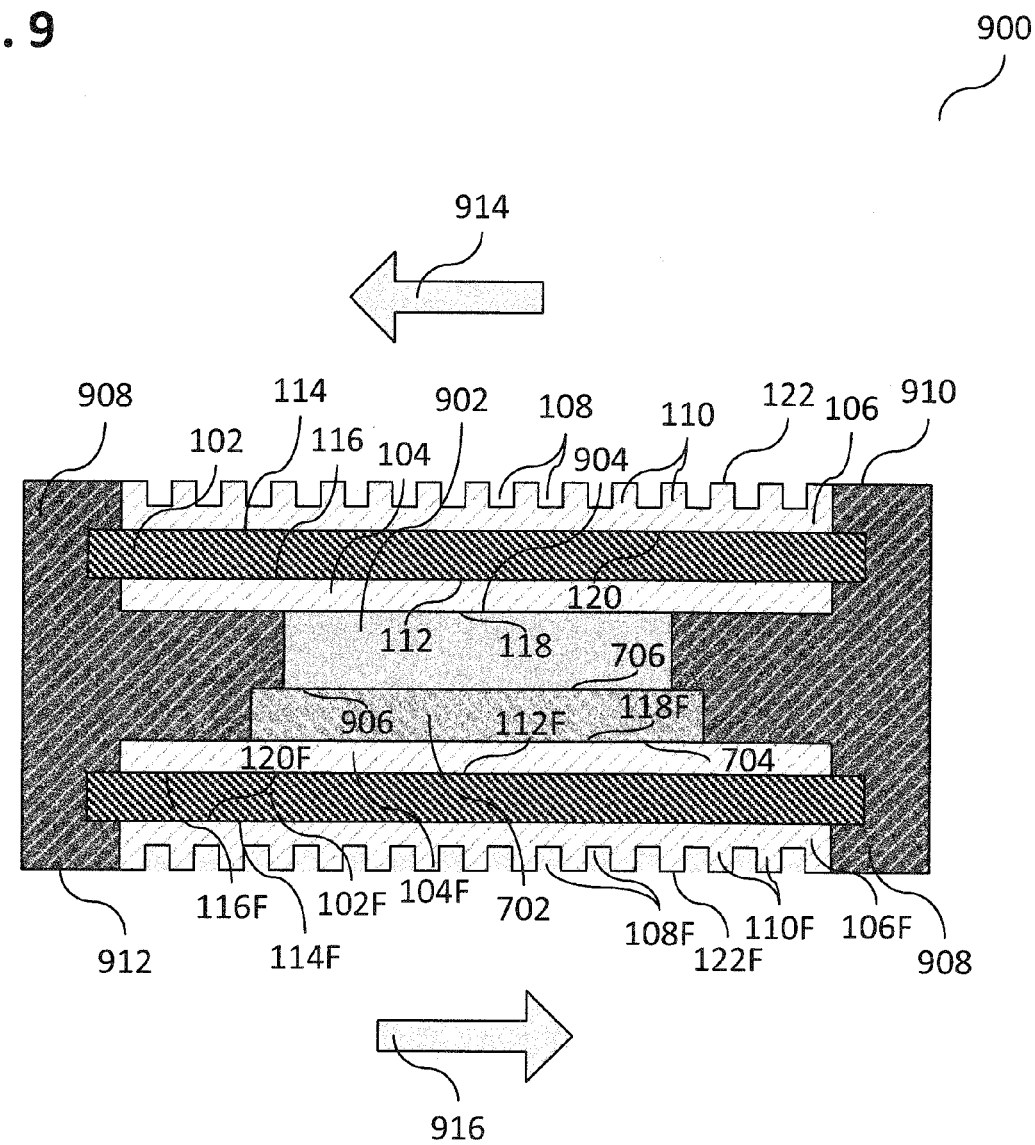
FIG. 9 shows a cross-sectional view of a chip arrangement according to various embodiments.

FIG. 9 shows a cross-sectional view of a chip arrangement 900 according to various embodiments.

The chip arrangement 900 may include at least one of the substrates and/or the chip arrangements, 700 or 800, as described above.

The chip arrangement 900 may include further at least one thermal interconnection 902 having a first side 904 and a second side 906 opposite the first side 904 and an encapsulation material 908 having a first side 910 and a second side 912 opposite the first side 910.

The at least one thermal interconnection 902 may be formed such that heat from the at least one chip 702 may be dissipated from at least one side of the at least one chip 702 to at least one of the both substrates.

Further, the substrate may be formed such that the ceramic carriers, 102 and 102F, may have a larger footprint than the first metal layer, 104 and 104F, and the second metal layers, 106 and 106F.

In various embodiments, the at least one thermal interconnection 902 may be formed at least partially over the second side 706 of the chip at least one 702, wherein the second side 906 of the at least one thermal interconnection 902 may be formed at least partially adjacent to the second side 706 of the at least one chip 702. The first side 904 of the at least one thermal interconnection 902 may be formed at least partially adjacent to the first side 118 of the first metal layer 104. Thus, the at least one thermal interconnection 902 may be sandwiched between the at least one chip 702 and the substrate.

Although, FIG. 9 shows a specific arrangement of the at least one thermal interconnection 902 within the chip arrangement 900, it is understood, that the at least one thermal interconnection 902 may be also disposed at least partially on the other side of the at least one chip 702. In other words, the thermal interconnection 902 may be sandwiched between the at least one chip 702 and the further substrate.

The chip arrangement 900 may include one or more chips 702 and/or one or more thermal interconnects 902, such as a plurality of chips 702 and/or a plurality of thermal interconnections 902.

The at least one thermal interconnection 902 may have a thickness, wherein the thickness may be a distance extending between the first side 704 and the second side 706 of the at least one thermal interconnection 902. The thickness of the at least one thermal interconnection 902 may be in the range from about 5 µm to about 5 mm, e.g. in the range from about 100 µm to about 1 mm, e.g. in the range from about 50 µm to about 0.5 mm.

The at least one thermal interconnection 902 may be formed such that the footprint of the at least one thermal interconnection 902 may be at least one of the group of geometrical footprint shapes, wherein the group of geometrical footprint shapes may include or consist of: a circle, a square, a rectangle, a rhombus, a trapezoidal, a parallelogram, a triangle, an ellipse, a pentagon, a hexagon, a heptagon, an octagon, a nonagon, a polygon, and the like.

The at least one thermal interconnection 902 may be formed such that the footprint of the at least one thermal interconnection 902 may have an area in the range from about 0.1 mm² to about 1000 mm², e.g. in the range from about 1 mm² to about 10 mm², e.g. in the range from about 0.5 mm² to about 25 mm².

The at least one thermal interconnection 902 may be formed such that the body shape of the at least one thermal interconnection 902 may be at least one of the group of geometrical body shapes, wherein the group of geometrical body shapes may include or consist of: a cube, a cuboid, a cylinder, a parallelepiped, a prism, and the like.

The at least one thermal interconnection 902 may be formed from at least one of the group of thermal conductive materials, wherein the group of thermal conductive materials may include or consist of: copper (Cu), aluminum (Al), nickel (Ni), gold (Au), silver (Ag), palladium (Pd), platinum (Pt), copper alloys, aluminum alloys, nickel alloys, gold alloys, silver alloys, palladium alloys, platinum alloys, and the like.

In various embodiments, the footprint of the at least one thermal interconnection 902 may be smaller than the footprint of the at least one chip 702.

In various embodiments, the footprint of the at least one thermal interconnection 902 may be equal to or larger than the footprint of the at least one chip 702.

The chip arrangement 900 may be formed such that the at least one chip 702, the at least one thermal interconnection 902, the substrate, and the further substrate may form a centered stack, wherein the substrate and the further substrate may be disposed on the external (or outer) sides (i.e. disposed to the outside) of the chip arrangement 900. The substrate and the further substrate may be disposed at the external sides of the chip arrangement 900 such that the PinFin structures, 110 and 110F, of the both substrates may be disposed at the external sides of the chip arrangement 900. In other words, the PinFin structures, 110 and 110F, of the both substrates may be disposed such that the structures, 110 and 110F, of the both substrates may be exposed at least partially to the outside of the chip arrangement 900. The at least one thermal interconnection 902 and the at least one chip 702 may be disposed between the substrate and the further substrate. The encapsulation material (or mold compound) 908 may be disposed at least partially at the side walls of the at least one chip 702, the at least one thermal interconnection 902, the substrate, and the further substrate which may form a centered stack.

The encapsulation material (or mold compound) 908 having a first side 910 and a second side 912 opposite the first side 910 may be formed from at least one of the group of encapsulation materials, wherein the group of encapsulation materials may include or consist of: polyester resin, vinyl ester resin, synthetic resin, fiberglass, epoxy, polymers, polyimide (PI), polyamide (PA), Polyamide-imide (PAI), poly(methyl glutarimide) (PMGI), SU-8, Phenol formaldehyde resins (PF), Poly(methyl methacrylate) (PMMA), any combination of these encapsulation materials, and the like.

The encapsulation material 908 may be formed by means of at least one of the group of molding methods, wherein the group of molding methods may include or consist of: compression molding, injection molding, laminating, transfer molding, matrix molding, and the like.

The encapsulation material 908 may be formed at least partially at the side walls of the at least one chip 702, the at least one thermal interconnection 902, the substrate, and the further substrate, which may form a centered stack such that the first side 910 and the second side 912 of the encapsulation material 908 may be formed substantially planar with the second side 122 of the substrate and the second side 122F of the further substrate. In other words, the centered stack which may be formed by the at least one chip 702, the at least one thermal interconnection 902, the substrate, and the further substrate and the encapsulation material 908 may form a block (or e.g. a cuboid), wherein the second side 122 of the substrate and the second side 122F of the further substrate may be exposed at least partially to the outside of the chip arrangement 900.

The encapsulation material 908 may be formed such that the encapsulation material 908 may seal at least partially the centered stack formed by the at least one chip 702, the at least one thermal interconnection 902, the substrate, and the further substrate. The sealing of the centered stack formed by the at least one chip 702, the at least one thermal interconnection 902, the substrate, and the further substrate may allow for cooling the chip arrangement 900 by means of a cooling fluid (or liquid), such as water, and the like, being applied to at least one of the at least partially exposed sides, 122 and 122F, of the second metal layers, 106 and 106F.

The both arrows, 914 and 916, may represent the direction of such an applied cooling fluid. The cooling fluid may be applied either by means of a cooling fluid circuit, wherein the cooling fluid circuit direction may be applied clockwise or counterclockwise, or by means of a parallel cooling fluid flow which may be applied in the same direction on both sides of the chip arrangement 900.

Figure 10:
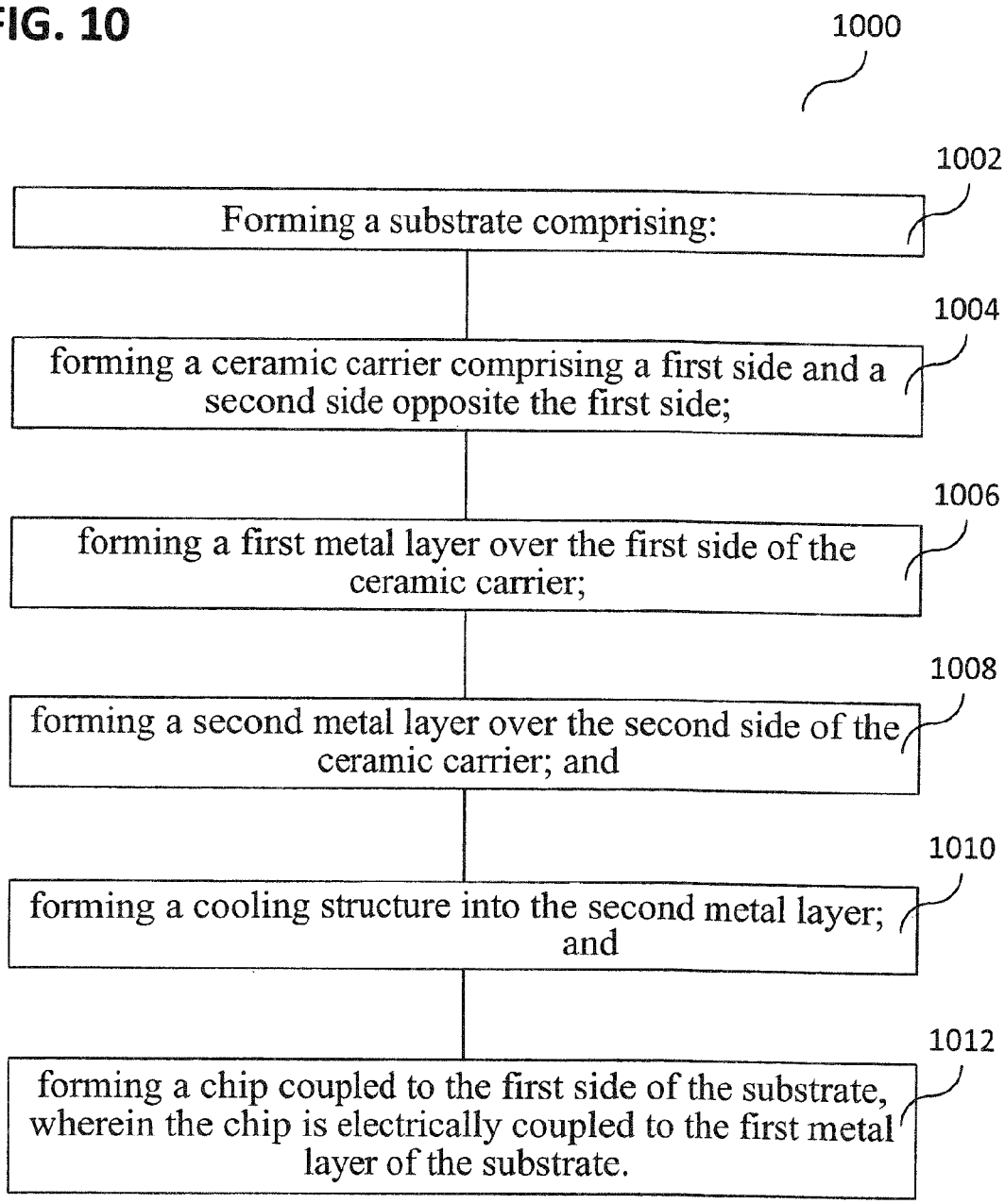
FIG. 10 shows a method for manufacturing a chip arrangement according to various embodiments.

In FIG. 10 a diagram of a method 1000 for forming a chip arrangement is shown according to various embodiments.

The method 1000 may include: forming a substrate (in 1002) including: forming a ceramic carrier having a first side and a second side opposite the first side (in 1004); forming a first metal layer over the first side of the ceramic carrier (in 1006); forming a second metal layer over the second side of the ceramic carrier (in 1008); and forming a cooling structure into or over the second metal layer (in 1010); and forming a chip which may be coupled to the first side of the substrate, wherein the chip may be electrically coupled to the first metal layer of the substrate (in 1012).

The substrate may be formed similar as the substrates described above.

The method 1000 for forming a chip arrangement further may include: forming a further substrate, including: forming a ceramic carrier having a first side and a second side opposite the first side; forming a first metal layer over the first side of the ceramic carrier; forming a second metal layer over the second side of the ceramic carrier; and forming a cooling structure into or over the second metal layer; wherein the chip may be sandwiched between the substrate and the further substrate and furthermore may be coupled to the further substrate, wherein the chip may be furthermore electrically coupled to the first metal layer of the further substrate.

The further substrate may be formed similar as the substrates described above.

Further, the method 1000 may include: forming an encapsulation material at least partially over the sidewalls of the chip and the substrate, wherein the encapsulation material may be formed similar as described above.

The second metal layer of the substrate may be at least partially exposed.

The method further may include: forming an encapsulation material at least partially over the sidewalls of the chip and the substrate and the further substrate.

The second metal layer of the substrates and the second metal layer of the further substrate may be at least partially exposed.

Figure 11:
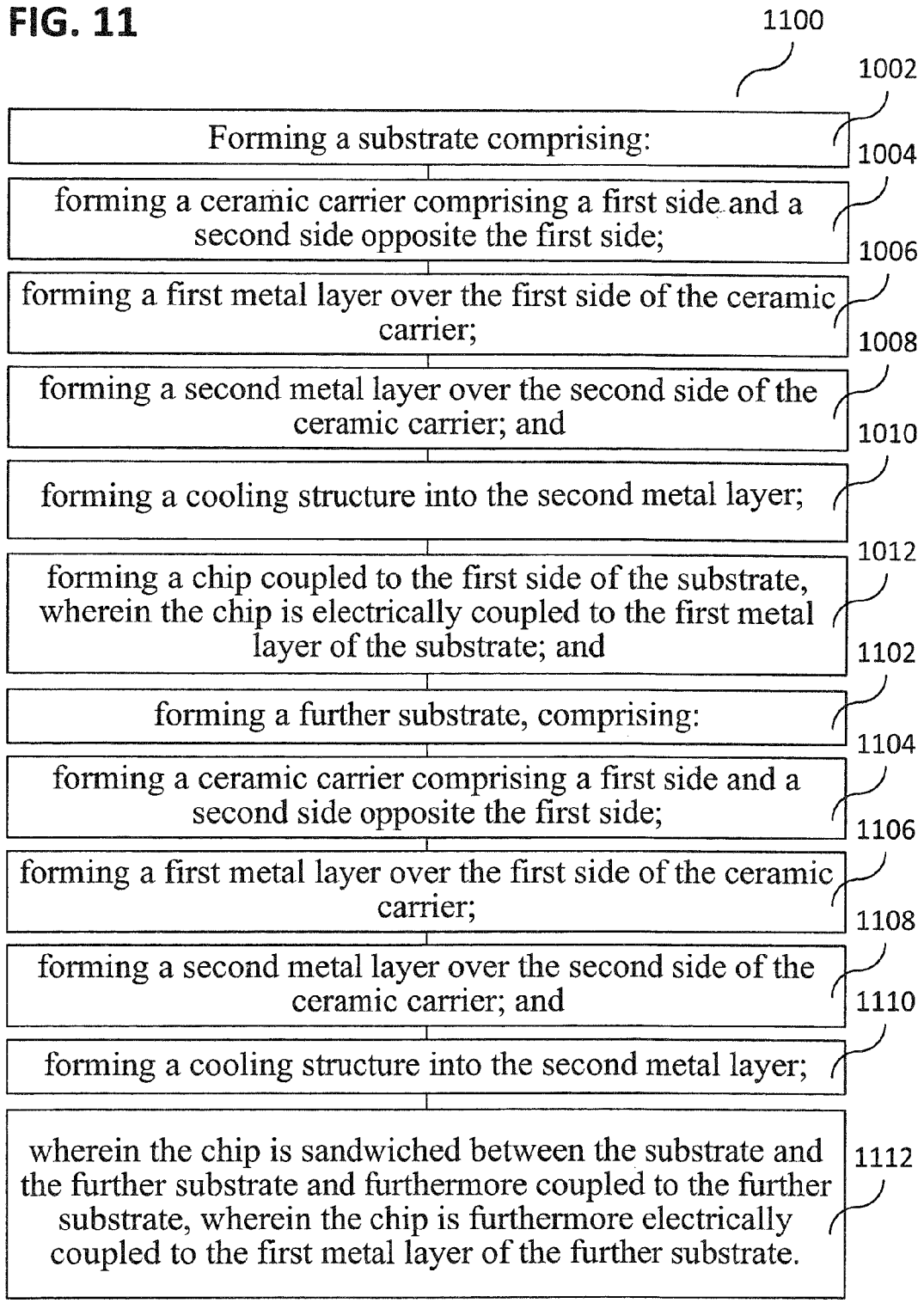
FIG. 11 shows a method for manufacturing a chip arrangement according to various embodiments.

In FIG. 11 a diagram of a method 1100 for forming a chip arrangement is shown according to various embodiments. The method 1100 may include: forming a substrate (in 1002) including: forming a ceramic carrier having a first side and a second side opposite the first side (in 1004); forming a first metal layer over the first side of the ceramic carrier (in 1006); forming a second metal layer over the second side of the ceramic carrier (in 1008); and forming a cooling structure into or over the second metal layer (in 1010); forming a chip which may be coupled to the first side of the substrate, wherein the chip may be electrically coupled to the first metal layer of the substrate (in 1012); and forming a further substrate (in 1102), including: forming a ceramic carrier having a first side and a second side opposite the first side (in 1104); forming a first metal layer over the first side of the ceramic carrier (in 1106); forming a second metal layer over the second side of the ceramic carrier (in 1108); and forming a cooling structure into or over the second metal layer (in 1110); wherein the chip may be sandwiched between the substrate and the further substrate and furthermore may be coupled to the further substrate, wherein the chip may be furthermore electrically coupled to the first metal layer of the further substrate (in 1112).

The substrate, the chip, and the further substrate may be formed similar as the substrates, the at least one chip, and the further substrate described above.

In various embodiments, a substrate may include: a ceramic carrier comprising a first side and a second side opposite the first side; a first metal layer disposed over the first side of the ceramic carrier; a second metal layer disposed over the second side of the ceramic carrier; and a cooling structure formed into or over the second metal layer.

In various embodiments, the cooling structure may be formed by means of a pin structure.

In various embodiments, the cooling structure may be formed by means of a fin structure.

In various embodiments, the cooling structure may be formed by means of a combination of a pin structure and a fin structure.

In various embodiments, the cooling structure may be formed by means of etching, plasma etching, bonding (e.g. wire bonding), welding, soldering, and/or structured deposition.

In various embodiments, the ceramic carrier may include at least one metal oxide or metal nitride; and wherein the first metal layer and the second metal layer may include copper.

In various embodiments, a chip arrangement may include: a substrate, which may include: a ceramic carrier having a first side and a second side opposite the first side; a first metal layer which may be disposed over the first side of the ceramic carrier; a second metal layer which may be disposed over the second side of the ceramic carrier; and a cooling structure which may be formed into or over the second metal layer; and a chip which may be coupled to the first side of the substrate, wherein the chip may be electrically coupled to the first metal layer of the substrate.

In various embodiments, further the chip arrangement may include a further substrate which may include: a ceramic carrier having a first side and a second side opposite the first side; a first metal layer which may be disposed over the first side of the ceramic carrier; a second metal layer which may be disposed over the second side of the ceramic carrier; and a cooling structure which may be formed into or over the second metal layer; wherein the chip may be sandwiched between the substrate and the further substrate and furthermore may be coupled to the further substrate, wherein the chip may be furthermore electrically coupled to the first metal layer of the further substrate.

In various embodiments, the chip arrangement, further may include: an encapsulation material which may be disposed at least partially over the sidewalls of the chip and the substrate.

In various embodiments, the second metal layer of the substrate may be at least partially exposed.

In various embodiments, the chip arrangement further may include: an encapsulation material which may be disposed at least partially over the sidewalls of the chip and the substrate and the further substrate.

In various embodiments, the second metal layer of the substrates and the second metal layer of the further substrate may be at least partially exposed.

In various embodiments, the ceramic carrier may include at least one metal oxide or metal nitride, and the first metal layer and the second metal layer may include copper.

In various embodiments, the ceramic carrier of the substrate and/or the ceramic carrier of the further substrate may include at least one metal oxide or metal nitride, and the first metal layer and the second metal layer may include copper.

In various embodiments, a method for forming a chip arrangement may be provided. The method may include: forming a substrate including: forming a ceramic carrier having a first side and a second side opposite the first side; forming a first metal layer over the first side of the ceramic carrier; forming a second metal layer over the second side of the ceramic carrier; and forming a cooling structure into or over the second metal layer; and forming a chip which may be coupled to the first side of the substrate, wherein the chip may be electrically coupled to the first metal layer of the substrate.

In various embodiments, the method for forming a chip arrangement further may include: forming a further substrate, including: forming a ceramic carrier having a first side and a second side opposite the first side; forming a first metal layer over the first side of the ceramic carrier; forming a second metal layer over the second side of the ceramic carrier; and forming a cooling structure into or over the second metal layer; wherein the chip may be sandwiched between the substrate and the further substrate and furthermore may be coupled to the further substrate, wherein the chip may be furthermore electrically coupled to the first metal layer of the further substrate.

In various embodiments, the method further may include: forming an encapsulation material at least partially over the sidewalls of the chip and the substrate.

In various embodiments, the second metal layer of the substrate may be at least partially exposed.

In various embodiments, the method further may include: forming an encapsulation material at least partially over the sidewalls of the chip and the substrate and the further substrate.

In various embodiments, the second metal layer of the substrates and the second metal layer of the further substrate may be at least partially exposed.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip arrangement comprising:
a first substrate, comprising:
   a ceramic carrier comprising a first side and a second side opposite the first side;
   a first metal layer disposed over the first side of the ceramic carrier;
   a second metal layer disposed over the second side of the ceramic carrier;
   a cooling structure formed into or over the second metal layer; wherein the cooling structure is formed from the same metal as the second metal layer;
   wherein the cooling structure is configured to form a structure selected from a group consisting of a pin structure, a fin structure, and combinations thereof;
a chip disposed on the first metal layer of the first side of the first substrate, wherein the chip is electrically coupled to the first metal layer of the first substrate; and
a second substrate, comprising:
   a ceramic carrier comprising a first side and a second side opposite the first side;
   a first metal layer disposed over the first side of the ceramic carrier;
   a second metal layer disposed over the second side of the ceramic carrier; and
   a cooling structure formed into or over the second metal layer; wherein the cooling structure is formed from the same metal as the second metal layer;
wherein the chip is sandwiched between the first substrate and the second substrate and furthermore directly coupled to the second substrate, wherein the chip is furthermore electrically coupled to the first metal layer of the second substrate.

2. The chip arrangement of claim 1, further comprising:
encapsulation material disposed at least partially over the sidewalls of the chip and at least one of the first substrate and/or the second substrate.

3. The chip arrangement of claim 1, further comprising:
encapsulation material disposed at least partially over the sidewalls of the chip and the first substrate and the second substrate.

4. The chip arrangement of claim 3,
wherein the second metal layer of the first substrate and the second metal layer of the second substrate are at least partially exposed.

5. The chip arrangement of claim 1,
wherein the ceramic carrier comprises at least one metal oxide or metal nitride;
and wherein the first metal layer and the second metal layer comprise copper.

6. The chip arrangement of claim 1,
wherein the ceramic carrier of the first substrate and/or the ceramic carrier of the second substrate comprise at least one metal oxide or metal nitride; and
wherein the first metal layer and the second metal layer comprise copper.

7. The chip arrangement of claim 1, wherein the second metal layer and the cooling structure are formed of a single, continuous piece of material.

8. The chip arrangement of claim 1, wherein the first metal layer is formed from the same metal as the second metal layer.

9. A chip arrangement comprising:
a first substrate, comprising:
   a ceramic carrier comprising a first side and a second side opposite the first side;
   a first metal layer disposed over the first side of the ceramic carrier;
   a second metal layer disposed over the second side of the ceramic carrier;
   a cooling structure formed into or over the second metal layer; wherein the cooling structure is formed from the same metal as the second metal layer;
   wherein the cooling structure is configured to form a structure selected from a group consisting of a pin structure, a fin structure, and combinations thereof;
a chip disposed on the first metal layer of the first side of the first substrate, wherein the chip is electrically coupled to the first metal layer of the first substrate; and
a second substrate, comprising:
   a ceramic carrier comprising a first side and a second side opposite the first side;
   a first metal layer disposed over the first side of the ceramic carrier;
   a second metal layer disposed over the second side of the ceramic carrier; and
   a cooling structure formed into or over the second metal layer; wherein the cooling structure is formed from the same metal as the second metal layer;
wherein the chip is sandwiched between the first substrate and the second substrate and furthermore coupled to the second substrate, wherein the chip is furthermore electrically coupled to the first metal layer of the second substrate; and wherein the chip arrangement is configured to have a cooling fluid applied to all sides of the chip arrangement.

10. A method for forming a chip arrangement, comprising:
forming a first substrate, comprising:
   forming a ceramic carrier comprising a first side and a second side opposite the first side;
   forming a first metal layer over the first side of the ceramic carrier;
   forming a second metal layer over the second side of the ceramic carrier; and
   forming a cooling structure over the second metal layer; wherein the cooling structure is formed from the same metal as the second metal layer;
   wherein the cooling structure is configured to form a structure selected from a group consisting of a pin structure, a fin structure, and combinations thereof;
disposing a chip on the first metal layer, wherein the chip is electrically coupled to the first metal layer;
forming a second substrate, comprising:
   forming a ceramic carrier comprising a first side and a second side opposite the first side;
   forming a first metal layer over the first side of the ceramic carrier;
   forming a second metal layer over the second side of the ceramic carrier; and
   forming a cooling structure into or over on the second metal layer;
   wherein the cooling structure is formed from the same metal as the second metal layer;
wherein the chip is sandwiched between the first substrate and the second substrate and furthermore directly coupled to the second substrate, wherein the chip is furthermore electrically coupled to the first metal layer of the second substrate.

11. The method of claim 10, further comprising:
forming an encapsulation material at least partially over the sidewalls of the chip and at least one of the first substrate and/or the second substrate.

12. The method of claim 11,
wherein the second metal layer of the at least one of the first substrate and/or the second substrate is at least partially exposed.

13. The method of claim 10, further comprising: forming an encapsulation material at least partially over the sidewalls of the chip and the first substrate and the second substrate.

14. The method of claim 13,
wherein the second metal layer of the first substrate and the second metal layer of the second substrate are at least partially exposed.

15. The method of claim 10, wherein the first metal layer comprises a first side and a second side opposite the first side, wherein the first side of the first metal layer is disposed over the chip carrier, and further comprising a thermal interconnect disposed on the second side of the first metal layer, wherein the thermal interconnect is configured to directly contact a chip.

16. The method of claim 10, wherein the second metal layer and the cooling structure are formed of a single, continuous piece of material.

17. The method of claim 10, wherein the first metal layer is formed from the same metal as the second metal layer.

* * * * *